US011817854B2

(12) United States Patent
Tesu et al.

(10) Patent No.: US 11,817,854 B2
(45) Date of Patent: Nov. 14, 2023

(54) GENERATION OF POSITIVE AND NEGATIVE SWITCH GATE CONTROL VOLTAGES

(71) Applicant: Skyworks Solutions, Inc., Irvine, CA (US)

(72) Inventors: Ion Constantin Tesu, Austin, TX (US); Joselyn Torres-Torres, Austin, TX (US); Stefan Noel Mastovich, Austin, TX (US); James Edward Heckroth, Austin, TX (US); Krishna Pentakota, Austin, TX (US); Long Van Nguyen, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 63 days.

(21) Appl. No.: 17/540,894

(22) Filed: Dec. 2, 2021

(65) Prior Publication Data

US 2022/0190821 A1 Jun. 16, 2022

Related U.S. Application Data

(60) Provisional application No. 63/125,226, filed on Dec. 14, 2020.

(51) Int. Cl.
*H02M 1/08* (2006.01)
*H03K 17/567* (2006.01)
*H02P 27/06* (2006.01)

(52) U.S. Cl.
CPC ............ *H03K 17/567* (2013.01); *H02M 1/08* (2013.01); *H02P 27/06* (2013.01); *H03K 2217/0081* (2013.01)

(58) Field of Classification Search
CPC .................. H02M 1/08; H03K 17/567; H03K 2217/0081

(Continued)

(56) References Cited

U.S. PATENT DOCUMENTS 7,091,709 B2   8/2006 Suzuki
7,199,565 B1   4/2007 Demolli
(Continued)

FOREIGN PATENT DOCUMENTS

WO   2020086150 A2   4/2020

OTHER PUBLICATIONS

Onsemi, "Single 6 A High-Speed, Low-Side SiC MOSFET Driver," Semiconductor Components Industries, LLC, 2017, Rev. Apr. 3, 2019, Publication Order No. NCP51705/D, 21 pages.

(Continued)

*Primary Examiner* — William Hernandez
(74) *Attorney, Agent, or Firm* — Knobbe, Martens, Olson & Bear, LLP

(57) ABSTRACT

A technique for powering gate drivers in a half-bridge configuration uses a single external power supply to power each gate driver. A single on-chip regulator regulates the positive turn-on voltage for each switch. The regulator overhead, is also used as the negative voltage for turn-off, thus transferring the low-frequency variation of the external power supply to the negative turn-off voltage. Accordingly, a single on-chip regulator generates both the positive turn-on voltage and the negative turn-off voltage. In at least one embodiment, reuse of the switch turn-off current further reduces on-chip power dissipation. The on-chip regulator's output filter capacitor discharges during turn-on of the external power switching device. During turn-off, the current that discharges the switch gate capacitance recharges the regulator filter capacitor.

22 Claims, 7 Drawing Sheets

(58) Field of Classification Search
USPC .......................................... 327/108, 109, 110
See application file for complete search history.

(56) References Cited

U.S. PATENT DOCUMENTS

| | | |
|---|---|---|
| 7,999,523 B1 | 8/2011 | Caffee et al. |
| 8,947,112 B2 | 2/2015 | Yamanobe |
| 9,261,892 B2 | 2/2016 | Wang et al. |
| 9,337,824 B2 | 5/2016 | Piselli et al. |
| 9,537,581 B2 | 1/2017 | Mills et al. |
| 9,625,925 B2 | 4/2017 | Yan et al. |
| 9,698,654 B2 | 7/2017 | Santos et al. |
| 9,817,426 B2 | 11/2017 | Chellappa |
| 10,281,943 B1 | 5/2019 | Ho |
| 10,296,026 B2 | 5/2019 | Caffee et al. |
| 10,784,860 B1 | 9/2020 | Sakai |
| 2005/0248331 A1 | 11/2005 | Whittaker |
| 2007/0241731 A1 | 10/2007 | van Ettinger |
| 2008/0054867 A1 | 3/2008 | Soude et al. |
| 2008/0238385 A1 | 10/2008 | Nagata et al. |
| 2008/0303496 A1 | 12/2008 | Schlueter et al. |
| 2009/0295360 A1 | 12/2009 | Hellums |
| 2010/0117699 A1 | 5/2010 | Wu et al. |
| 2010/0156362 A1 | 6/2010 | Xie |
| 2010/0156364 A1 | 6/2010 | Cho et al. |
| 2011/0121802 A1 | 5/2011 | Zhu |
| 2012/0194119 A1* | 8/2012 | Kroeze .................. H02P 27/06 363/55 |
| 2012/0195079 A1* | 8/2012 | Kroeze ............... H02M 7/5387 363/55 |
| 2012/0195085 A1* | 8/2012 | Kroeze ................. H02M 7/487 363/132 |
| 2012/0195087 A1* | 8/2012 | Kroeze ................. H02M 7/487 363/134 |
| 2013/0082671 A1 | 4/2013 | Ivanov et al. |
| 2015/0185747 A1 | 7/2015 | Liu |
| 2015/0198960 A1 | 7/2015 | Zhang et al. |
| 2015/0286232 A1 | 10/2015 | Parikh |
| 2016/0224040 A1 | 8/2016 | Peluso et al. |
| 2016/0357206 A1 | 12/2016 | Liu |
| 2017/0093399 A1 | 3/2017 | Atkinson et al. |
| 2017/0115677 A1 | 4/2017 | Caffee et al. |
| 2017/0126329 A1 | 5/2017 | Gorecki et al. |
| 2017/0160757 A1 | 6/2017 | Yang |
| 2017/0244395 A1 | 8/2017 | Ojha et al. |
| 2018/0017984 A1 | 1/2018 | Mayer et al. |
| 2018/0053463 A1 | 2/2018 | Kong et al. |
| 2018/0129234 A1 | 5/2018 | Melgar et al. |
| 2018/0173258 A1 | 6/2018 | Singh |
| 2019/0109529 A1 | 4/2019 | Nobe et al. |

OTHER PUBLICATIONS

Rohm Semiconductors, "Isolation voltage 2500Vrms 1ch Gate Driver Providing Galvanic Isolation," Gate Driver Providing Galvanic Isolation Series, BM60054AFV-C Datasheet, Rev. 003, Apr. 23, 2018, 42 pages.

Klomark, S., "Design of an Integrated Voltage Regulator," Institution for Systemteknik, Oct. 17, 2003, 54 pages.

* cited by examiner

GENERATION OF POSITIVE AND NEGATIVE SWITCH GATE CONTROL VOLTAGES

CROSS-REFERENCE TO RELATED APPLICATION(S)

This application claims the benefit of U.S. Provisional Application No. 63/125,226, entitled "ON-CHIP GENERATION OF POSITIVE AND NEGATIVE SWITCH GATE CONTROL VOLTAGES FOR GATE DRIVER APPLICATIONS," naming Ion C. Tesu, Joselyn Torres-Torres, Stefan N. Mastovich, James E. Heckroth, Krishna Pentakota, and Long Nguyen as inventors, filed on Dec. 14, 2020, which application is incorporated herein by reference.

BACKGROUND

Field of the Invention

This disclosure is related to integrated circuits, and more particularly to voltage regulation circuits.

Description of the Related Art

In a typical control application, a processor system provides one or more control signals for controlling a load system. During normal operation, a large DC or transient voltage difference may exist between a domain of the processor system and a domain of the load system, thus requiring an isolation barrier between the processor system and the load system. For example, one domain may be grounded at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load system by a direct conduction path, an isolation communications channel allows communication between the two systems using optical (opto-isolators), capacitive, inductive (transformers), or electromagnetic techniques. In at least one embodiment, the isolation communications channel blocks DC signals and only passes AC signals. The intermediate system typically uses a voltage converter and an output driver to provide the control signal at voltage levels suitable for the load system.

Referring to FIG. 1, in an exemplary application (e.g., DC-DC converter or traction inverter), a power supply arrangement requires isolated power supplies for high-side and low-side gate drivers. Accordingly, the application uses a transformer-isolated DC-DC converter with isolated outputs VDDOH, MIDH, and GNDOH for high-side gate drivers SW-H, and isolated outputs VDDOL, MIDL, and GNDOL for low-side gate drivers SW-L. DC-DC controller 106 uses a simple feedback mechanism that regulates the multiple isolated output voltages and requires only one voltage, e.g., feedback voltage FB. Accordingly, the power supply arrangement of FIG. 1 regulates only one output voltage to a target level and other output voltages vary, to some degree, as a function of the load applied to those unregulated outputs.

In a conventional configuration, power switching devices require a positive control voltage (e.g., gate-to-emitter voltage $V_{GE}$ for IGBT devices and gate-to-source voltage $V_{GS}$ for SiC devices) for turn-on and require a negative control voltage for turn-off. The negative control voltage also reduces undesired parasitic turn-on events due to Miller capacitance feedback. Although the positive control voltage affects the on-resistance of the power switch (especially for SiC devices), the negative control voltage can have a larger tolerance around a target level if the Miller effect does not parasitically turn-on the device and the turn-off voltage does not exceed specified limits of the switching device. For example, a turn-on voltage of 15V might require ±0.5 V accuracy, while a turn-off voltage of −4 V tolerates a ±2.0 V variation.

In the illustrated half-bridge application, power supply 104 is a single external power supply (e.g., a DC-DC converter) that provides a positive power supply and a negative power supply for each gate driver product. These supplies power gate driver product 102 and gate driver product 108, thereby enabling the generation of a positive gate control voltage for the turn-on state and a negative gate control voltage for the turn-off state. The negative turn-off voltages are less critical than the positive turn-on voltages. However, power supply 104 actively regulates only one positive output (e.g., $V_{VDDOH}-V_{MIDH}$ or $V_{VDDOL}-V_{MIDL}$), so only one of the two gate driver products (e.g., gate driver 108) can provide a tightly controlled positive turn-on voltage to its switching device. The complementary gate driver of the half-bridge (e.g., gate driver 102) receives a less-well-regulated positive supply, resulting in a larger variation in its turn-on voltage.

A conventional approach to providing the positive and negative gate control voltages for both the high-side and the low-side gate drivers in a half-bridge configuration uses positive supply voltages ($V_{VDDOH}-V_{MIDH}$) and ($V_{VDDOL}-V_{MIDL}$). The negative supply voltages are ($V_{GNDOH}-V_{MIDH}$) and ($V_{GNDOL}-V_{MIDL}$). The voltage ($V_{VDDOL}-V_{MIDL}$) is fed back to DC-DC controller 106 to regulate the positive supply voltage ($V_{VDDOL}-V_{MIDL}$) to a target predetermined value. The other three voltages have less regulation than ($V_{VDDOL}-V_{MIDL}$) due to the independent load requirements of those supply voltages. The voltages are generated with simple rectifier circuits using diodes $D_{PH}$, $D_{NH}$, $D_{PL}$, $D_{NL}$, followed by filtering capacitors $C_{PH}$, $C_{NH}$, $C_{PL}$ and $C_{NL}$. The filter capacitors are placed near the high-side and low-side gate drivers to reduce parasitic inductance in the supply path from the capacitors to the drivers. The gate driver uses the externally-supplied supply voltages ($V_{VDDOH}-V_{MIDH}$) and ($V_{VDDOL}-V_{MIDL}$) to generate the positive gate voltages for turning on a high-power drive device. The gate drivers use the externally-supplied supply voltages ($V_{GNDOH}-V_{MIDH}$) and ($V_{GNDOL}-V_{MIDL}$) to generate the negative gate voltages for turning off the high-power drive device.

An alternative technique for providing the positive and negative gate control voltages for both the high-side and the low-side gate drivers in a half-bridge configuration uses two external power supplies. One power supply generates a positive voltage to turn on a high-power drive device and another power supply generates the negative voltage to turn off the high-power drive device. Each gate driver requires both power supplies. This alternative technique is more expensive than the solution described above because it requires more windings in a typical DC-DC converter power supply configuration. Positive and negative voltages that are generated in this way have fixed voltage levels and require redesign if different gate control voltages are used.

Another alternative technique uses only one external power supply. A Zener diode, a resistor and a filtering capacitor are configured to generate the negative voltage. Although this alternative is less expensive than using two external power supplies, both alternatives for generating the positive and negative power supplies for the gate driver have fixed output voltages and require redesign if different gate control voltages are used. Yet another technique includes an on-chip low-dropout (LDO) voltage regulator inside the gate driver to generate a voltage referenced to GNDO (e.g., a voltage less than VDDO). The low-dropout regulator introduces additional overhead that increases the power dissipated by the gate driver and increases the amount of power to be delivered by the external power supplies. A technique to improve positive supply regulation includes adding a low-dropout (LDO) voltage regulator for each positive gate driver supply. A conventional LDO voltage regulator requires overhead voltage, resulting in an output voltage that is less than its input voltage. Thus, LDO voltage regulators are required for each gate driver to maintain the same turn-on voltage for the switches. The LDO voltage regulators can be external or integrated on the gate driver products. A traditional LDO voltage regulator dissipates an amount of power that is proportional to its load current and its overhead voltage. Thus, the addition of LDO voltage regulators increases system power dissipation. Moreover, the power that can be dissipated by the gate driver is limited by the package thermal characteristics. Therefore, adding an on-chip LDO voltage regulator reduces the amount of overall gate charge that can be delivered to the power switch for a particular switching frequency.

Accordingly, improved techniques for providing positive and negative gate control voltages for a high-side gate driver and a low-side gate driver in a half-bridge configuration are desired.

SUMMARY OF EMBODIMENTS OF THE INVENTION

In at least one embodiment, a method for controlling a high-power drive device includes generating a positive turn-on voltage and a negative turn-off voltage for the high-power drive device by a first gate driver product based on a first power supply voltage received from a first integrated circuit terminal, a second power supply voltage received from a second integrated circuit terminal, and a regulated power supply voltage on a third integrated circuit terminal. The positive turn-on voltage is a difference between the first power supply voltage and the regulated power supply voltage and has a predetermined voltage level.

In at least one embodiment, a system for controlling a high-power drive device includes an output terminal of a driver integrated circuit, a first power supply terminal of the driver integrated circuit configured to receive a first power supply voltage, a second power supply terminal of the driver integrated circuit configured to receive a second power supply voltage, a third power supply terminal of the driver integrated circuit configured to provide a regulated voltage, and a voltage regulator circuit of the driver integrated circuit configured to provide the regulated voltage. The regulated voltage has a level between a first level of the first power supply voltage and a second level of the second power supply voltage. The regulated voltage is based on a predetermined voltage level for a difference between the first power supply voltage and the regulated voltage.

In at least one embodiment, a method for controlling a high-power drive device includes charging a control node of the high-power drive device by delivering charge from a voltage regulator filter capacitor and from a first power supply node via a gate driver coupled between the first power supply node and a second power supply node. The high-power drive device is coupled to a third power supply node. The method includes discharging the control node of the gate driver by delivering charge to the voltage regulator filter capacitor and to the second power supply node via the gate driver. The method includes regulating a voltage provided to the third power supply node based on a first voltage on the first power supply node, a second voltage on the second power supply node, and a predetermined turn-on voltage level.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique for powering each gate driver in a half-bridge configuration uses a single external positive power supply to power both gate drivers in the half-bridge configuration. Each gate driver includes a voltage regulator to provide the positive turn-on voltage for a corresponding switch. The regulator overhead, which is the difference between the external power supply voltage and the voltage regulator output voltage, is also used as the negative voltage for turn-off, thus transferring the low-frequency variation of the external power supply to the negative turn-off voltage while regulating the positive turn-on voltage to a programmed value. Low frequency variation of the negative turn-off voltage is acceptable since considerably more variation can be tolerated on the negative turn-off voltage without affecting system performance. Accordingly, a single voltage regulator with no additional power dissipation required for regulator overhead generates both the positive turn-on voltage and the negative turn-off voltage.

In at least one embodiment, reuse of the switch turn-off current further reduces on-chip power dissipation of the gate driver integrated circuit. The output filter capacitor of the voltage regulator discharges during turn-on of the external power switching device. During turn-off, the current that discharges the switch gate capacitance recharges the regulator filter capacitor. In an embodiment, the reduction in gate driver power dissipation reduces power demand from an external power supply, thereby simplifying power supply design and simplifying transformer design with reduced parasitic capacitive coupling between windings, which reduces total system cost. The technique reduces parasitic coupling between windings, which reduces switching noise coupling into both gate driver circuits.

Figure 1:
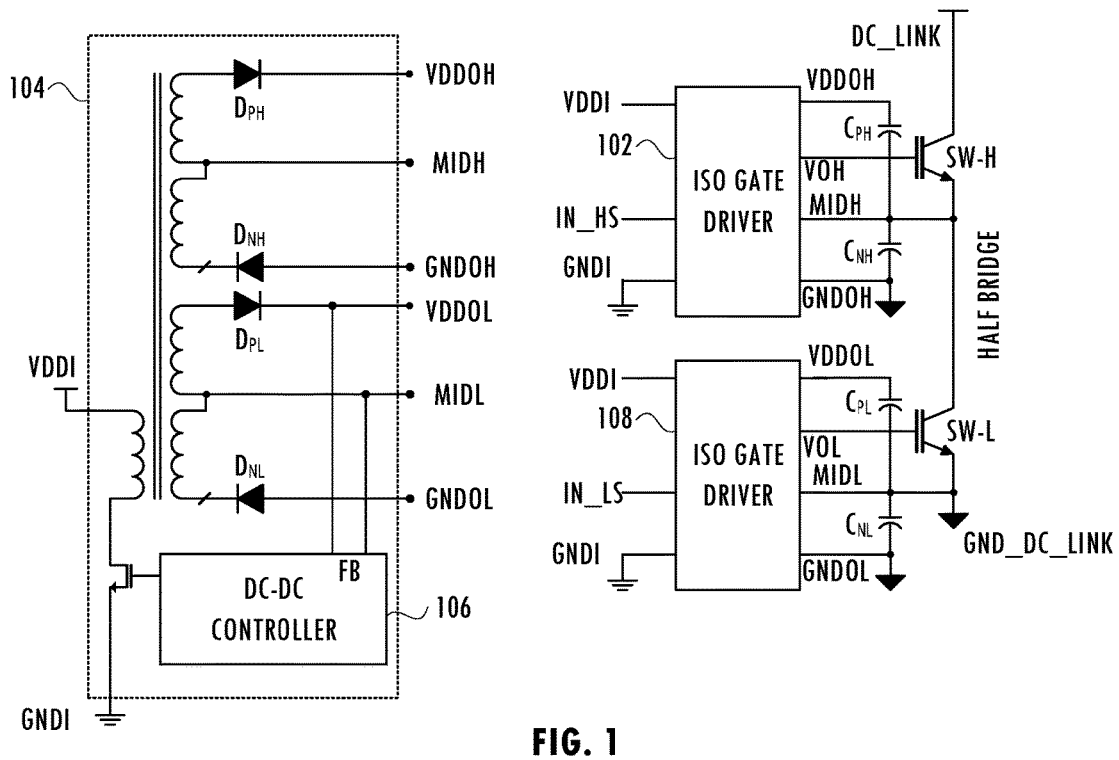
FIG. 1 illustrates a functional block diagram of a conventional power supply arrangement for high-side and low-side gate drivers in a half-bridge configuration.
Figure 2:
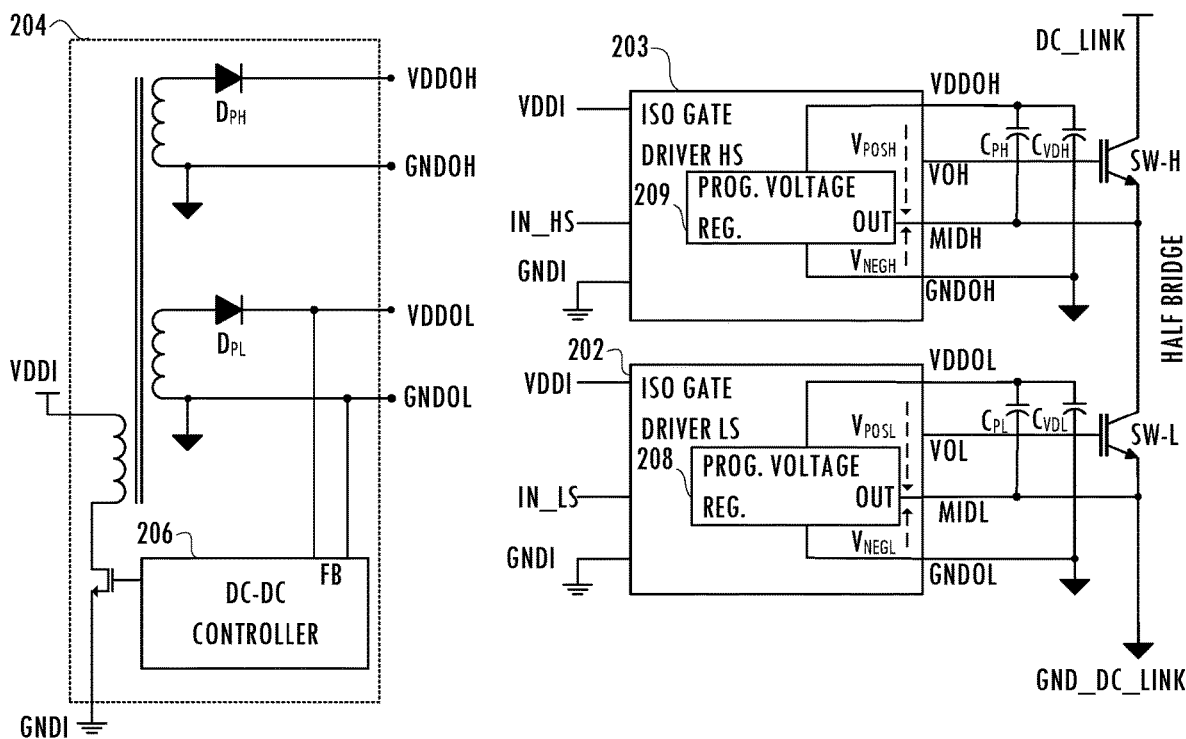
FIG. 2 illustrates a functional block diagram of a power supply arrangement for high-side and low-side gate drivers in a half-bridge configuration consistent with at least one embodiment of the invention.

Referring to FIG. 2, in at least one embodiment, power supply 204 is coupled to gate driver products 203 and 202, which include programmable voltage regulators 209 and 208, respectively. Power supply terminal VDDOH, power supply terminal VDDOL, power supply terminal GNDOH, and power supply terminal GNDOL receive corresponding power supply voltages from power supply 204. Power supply terminal MIDH and power supply terminal MIDL provide corresponding regulated voltage levels from gate driver 203 and gate driver 202 to corresponding nodes coupled to high-power drive devices SW-H and SW-L, respectively. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time. Regulated voltage levels provided on power supply terminal MIDH and MIDL are between the voltage levels on power supply terminal VDDOH and power supply terminal GNDOH and between the voltage levels on power supply terminal VDDOL and power supply terminal GNDOL, respectively.

In at least one embodiment, feedback voltage FB, which equals $(V_{VDDOL}-V_{GNDOL})$, is used by DC-DC controller 206 to regulate the positive supply voltage $(V_{VDDOL}-V_{GNDOL})$ to a target predetermined voltage level. The other positive supply voltage $(V_{VDDOH}-V_{GNDOH})$ has less regulation than $(V_{VDDOL}-V_{MIDL})$ due to its independent load requirements. The inclusion of programmable voltage regulator 208 and programmable voltage regulator 209 in gate driver product 202 and gate driver product 203, respectively, reduces the need for tightly controlled coupling between the transformer secondary windings of power supply 204, which can simplify the design of the transformer of power supply 204 and reduce system cost.

In at least one embodiment, the power supply arrangement operates in the same way for each of the two gate drivers. Although the following description addresses the high-side driver power supply arrangement, the description is applicable to the low-side driver supply arrangement. Rectifying diodes $D_{PH}$ and $D_{PL}$ are included for voltage rectification. Regulator filtering capacitor $C_{VDH}$, which is coupled between VDDOH and GNDOH, and regulator filtering capacitor $C_{VDL}$, which is coupled between VDDOL and GNDOL, provide filtering for the externally generated power supply. Regulator filtering capacitor $C_{PH}$, and regulator filtering capacitor $C_{PL}$ are coupled between power supply terminals VDDOH and MIDH and VDDOL and MIDL, respectively, to filter the voltage generated by the programmable voltage regulator in the corresponding gate driver. In an embodiment, the filtering capacitors are located near the corresponding gate driver product to reduce effects of parasitic inductances on a traction inverter board.

In at least one embodiment, programable voltage regulator 209 regulates a positive turn-on voltage (e.g., $V_{POSH}=V_{VDDOH}-V_{MIDH}$) to a predetermined level ranging from a minimum predetermined value to a maximum predetermined value using a feedback circuit. In general, positive turn-on voltage $V_{POSH}$ (e.g., having a voltage range of 14 V to 25 V) is sufficient to drive a variety of different types of IGBT or SiC devices. Due to the action of the programmable voltage regulators, negative turn-off voltages are $V_{NEGH}=-(V_{VDDOH}-V_{GNDOH}-V_{POSH})$ and $V_{NEGL}=-(V_{VDDOL}-V_{GNDOL}-V_{POSL})$. Programmable voltage regulator 209 and programmable voltage regulator 208 reject low-frequency variation in the $(V_{VDDOL}-V_{GNDOL})$ voltage or $(V_{VDDOH}-V_{GNDOH})$ voltage such that positive turn-on voltages $V_{POSH}$ and $V_{POSL}$ are regulated to corresponding predetermined voltage levels (e.g., voltage levels predetermined by a user using conventional integrated circuit programming techniques). Low-frequency variations of the external power supplies are passed on to negative turn-off voltages $V_{NEGH}$ and $V_{NEGL}$ where low-frequency variation has, at most, a negligible effect on system operation.

Figure 3A:
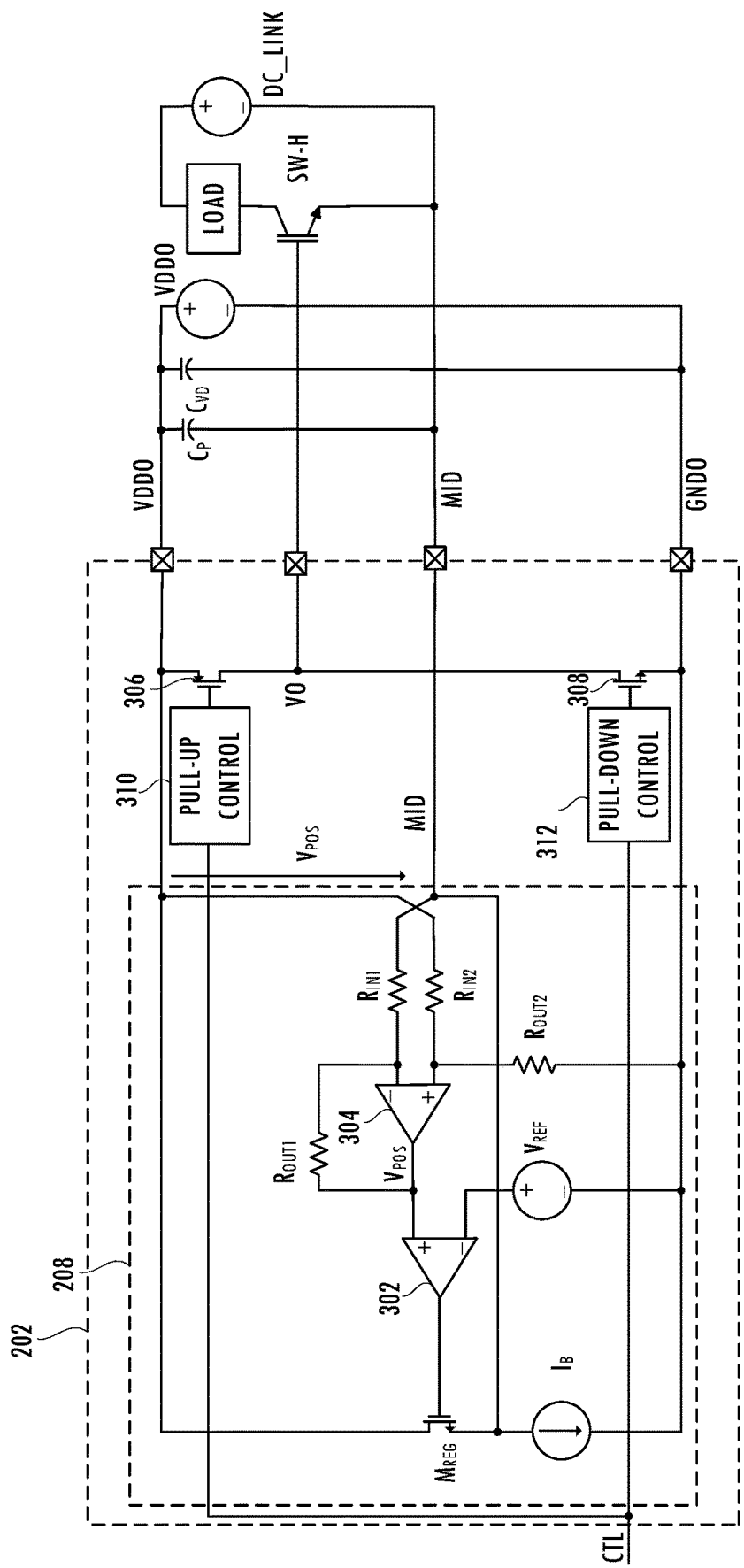
FIG. 3A illustrates a circuit diagram of a programmable voltage regulator included in a gate driver product consistent with at least one embodiment of the invention.
Figure 3B:
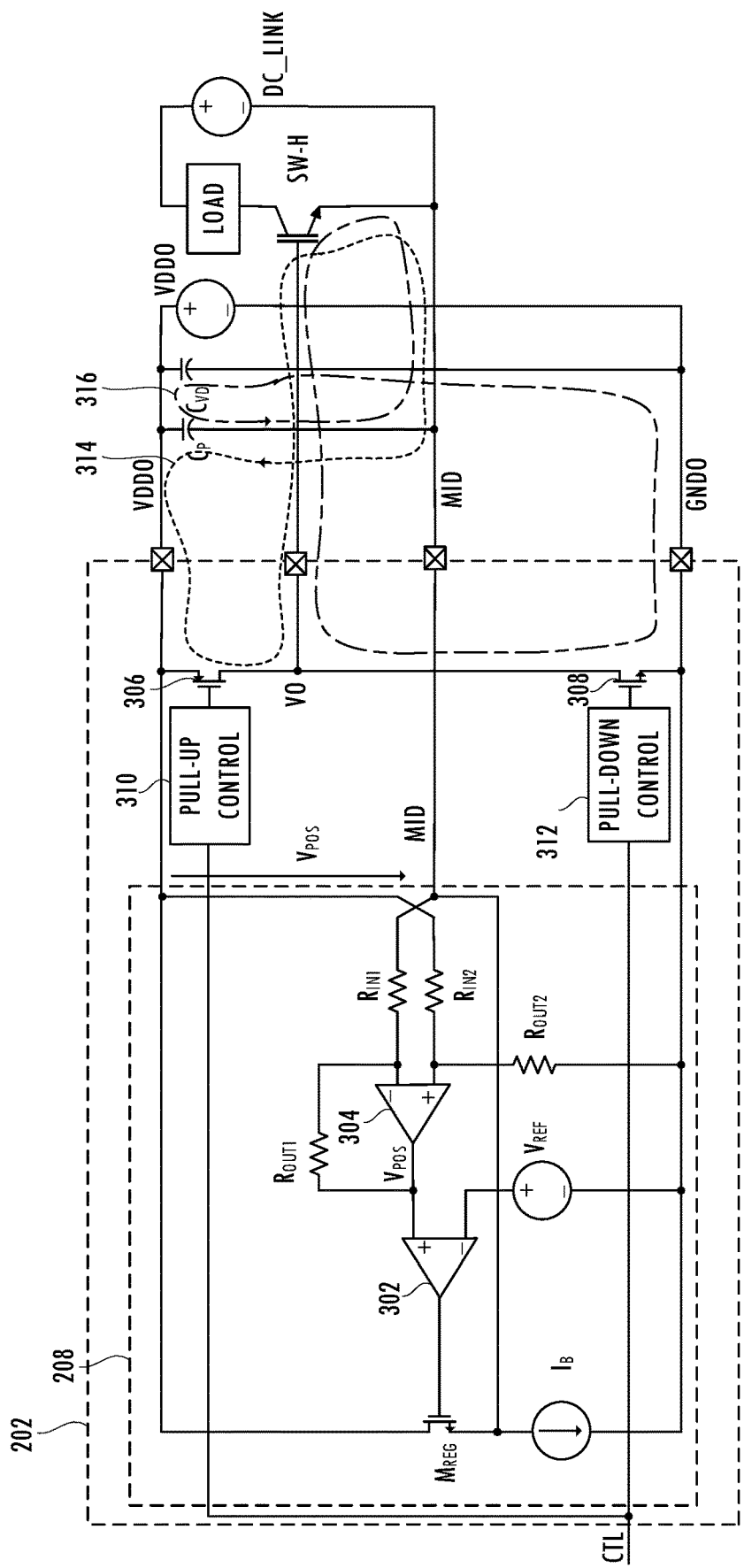
FIG. 3B illustrates charging current and discharging current in the power supply arrangement of FIG. 3A consistent with at least one embodiment of the invention.

FIGS. 3A and 3B illustrate an exemplary embodiment of a programmable voltage regulator included in a gate driver product. In at least one embodiment, gate driver product 202 controls output node Vo using pull-up control circuit 310, which pulls the voltage on output node Vo up towards $V_{VDDO}$, via output drive device 306, to turn on SW-H. Gate driver product 202 controls output node Vo using pull-down control circuit 312 which pulls the voltage on output node Vo down towards $V_{GNDO}$, via output drive device 308, to turn off SW-H. Power supply VDDO charges associated filtering capacitor $C_{VD}$. During the process for turning on high-power drive device SW-H, regulator filtering capacitor $C_P$ provides the current required to charge the gate of high-power drive device SW-H. This process partially discharges regulator filtering capacitor $C_P$. During the process of turning off high-power drive device SW-H, as the gate of high-power drive device SW-H discharges, charge returns to regulator filtering capacitor $C_P$, recharging regulator filtering capacitor $C_P$ to its pre-turn-on voltage. Recharging regulator filtering capacitor $C_P$ does not require additional current from gate driver product 202. Thus, the programmable voltage regulator topology discussed herein consumes less power than a conventional implementation. FIG. 3B illustrates directional charge path 314 and directional discharge path 316.

In at least one embodiment of programmable voltage regulator 208, a differential-to-single-ended amplifier realized by operational amplifier 304 and resistors $R_{IN1}$, $R_{IN2}$, $R_{OUT1}$, and $R_{OUT2}$ senses the regulator output voltage. In at least one embodiment, positive turn-on voltage $V_{POS}$ is programmable using at least one of resistors $R_{IN1}$, $R_{IN2}$, $R_{OUT1}$, and $R_{OUT2}$ or voltage reference $V_{REF}$, which are programmed during production test or during an initialization of the gate driver product using conventional programming techniques. In at least one embodiment, $R_{IN1}=R_{IN2}=R_{IN}$ and $R_{OUT1}=R_{OUT2}=R_{OUT}$. In at least one embodiment, comparator 302 has high gain and compares a single-ended version of positive turn-on voltage $V_{POS}$ to voltage reference $V_{REF}$ and drives regulating transistor $M_{REG}$ such that:

$$V_{POS} = V_{VDDO} - V_{MID} \cong \frac{R_{OUT}}{R_{IN}} \cdot V_{REF}.$$

Thus, the level of regulated voltage $V_{MID}$ is related to a ratio of a resistance of an output resistor to a resistance of an input resistor and the predetermined reference voltage. Current $I_B$ biases regulating transistor $M_{REG}$ and charges regulator filtering capacitor $C_P$ to achieve a target voltage level for positive turn-on voltage level $V_{POS}$. In operation, a small (e.g. 1 mA) maintenance level of current $I_B$ is sufficient to maintain the charge on regulator filtering capacitor $C_P$. In at least one embodiment, startup level $I_{B\_STARTUP}$ of current $I_B$ has a higher level than the main current and is provided during startup to reduce the time required to initially charge regulator filtering capacitor $C_P$ from 0 V to positive turn-on voltage $V_{POS}$. The value for startup level $I_{B\_STARTUP}$ is determined based on the value of the filtering capacitor $C_P$ and a predetermined regulator startup time tsTARTup for programmable voltage regulator 208:

$$I_{B\_STARTUP} \approx C_P \cdot \frac{V_{POS}}{t_{STARTUP}}.$$

At the end of the startup process the charge current is switched back to a maintenance level of current $I_B$ to reduce on-chip power dissipation.

Figure 3C:
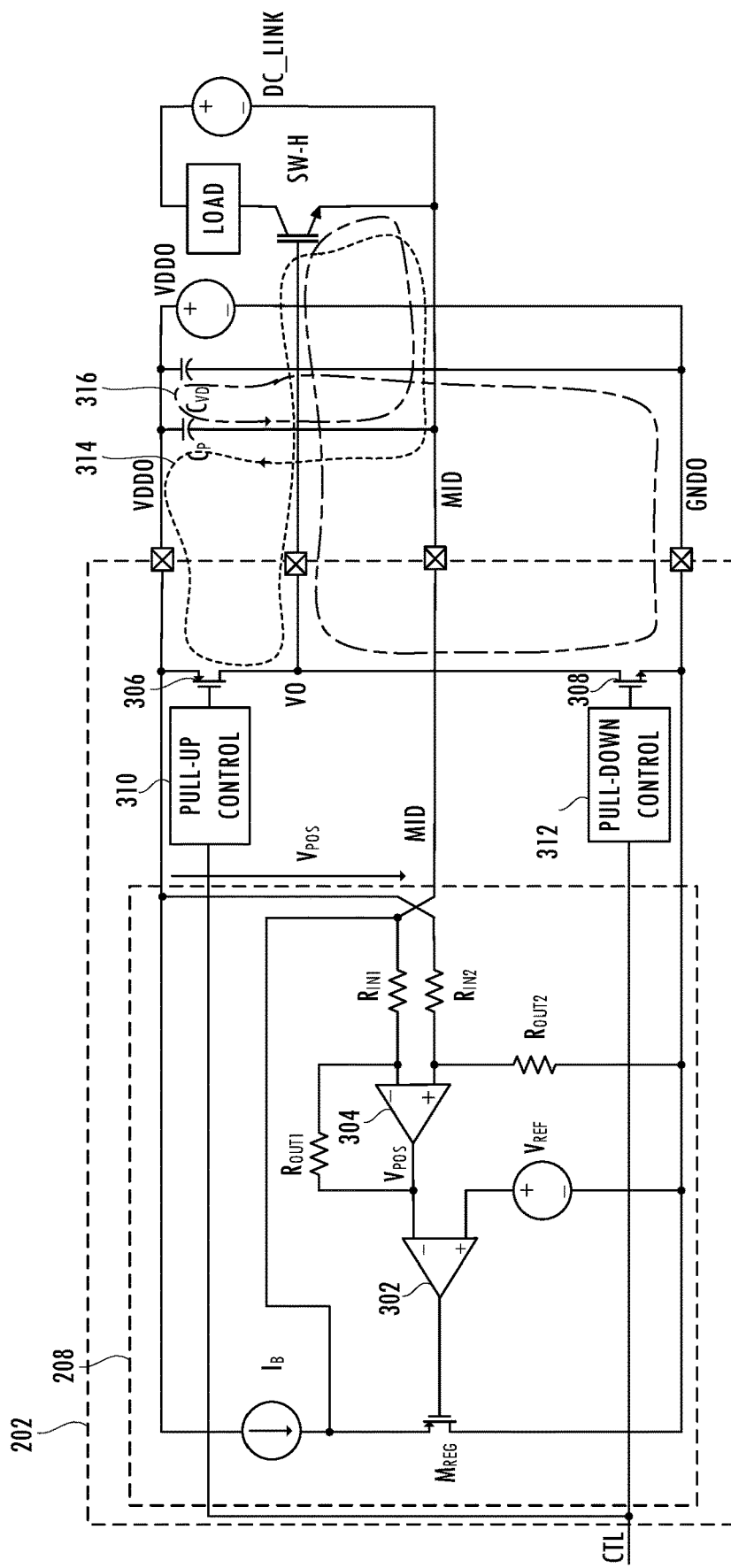
FIG. 3C illustrates a circuit diagram of an alternate embodiment of a programmable voltage regulator included in a gate driver product consistent with at least one embodiment of the invention.
Figure 3D:
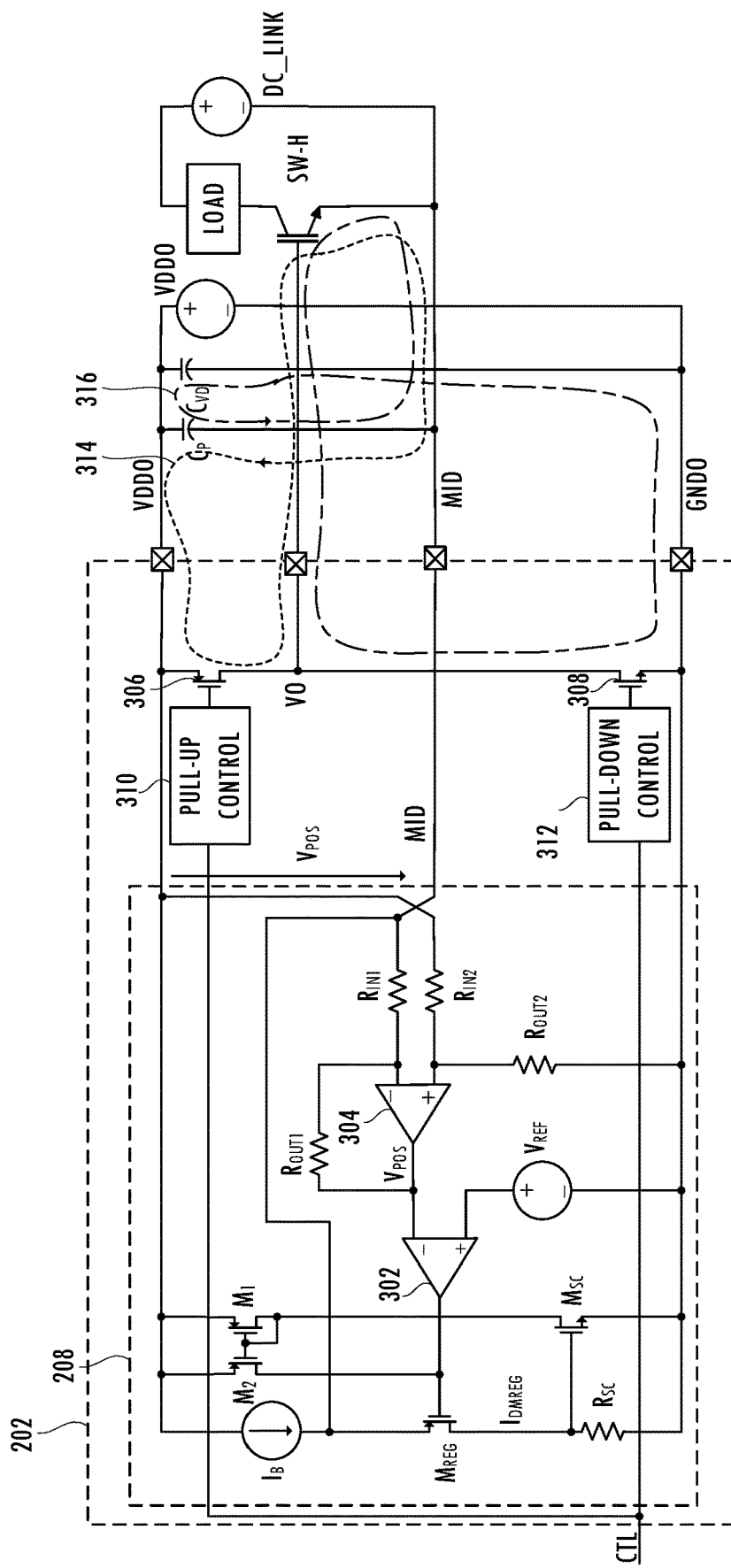
FIG. 3D illustrates a circuit diagram of an embodiment of a power supply arrangement including a programmable voltage regulator with current limiting included in a gate driver product consistent with at least one embodiment of the invention.

Although FIGS. 3A and 3B illustrate regulating transistor $M_{REG}$ as an n-type transistor, in other embodiments of a programmable voltage regulator included in a gate driver product, regulating transistor $M_{REG}$ is a p-type transistor, as illustrated in FIGS. 3C and 3D. The p-type regulating transistor turns on when positive turn-on voltage $V_{POS}$ drops and returns positive turn-on voltage $$V_{POS} \text{ to } \frac{R_{OUT}}{R_{IN}} \times V_{REF}$$

faster than embodiments using an n-type transistor for regulating transistor $M_{REG}$. In contrast, embodiments that include an n-type transistor for regulating transistor $M_{REG}$ use a charging path with $I_B$ and when positive turn-on voltage $V_{POS}$ drops, regulating transistor $M_{REG}$ may turn off and the bias current restores positive turn-on voltage $$V_{POS} \text{ to } \frac{R_{OUT}}{R_{IN}} \times V_{REF},$$

which is a slower process.

In at least one embodiment, programmable voltage regulator 208 includes a current-limiting circuit that limits the current of programmable voltage regulator 208 to a maximum amount to reduce or prevent damage to programmable voltage regulator 208 and possibly the high-power drive device. For example, FIG. 3D illustrates programmable voltage regulator 208 including devices $M_1$, $M_2$, and $M_{SC}$, and resistance $R_{SC}$ that form a circuit that limits the current provided by $M_{REG}$ (i.e., drain current $I_{DMREG}$) according to resistance $R_{SC}$ and threshold voltage $V_{TH}$ of device $M_{SC}$ according to the following relationship:

$$I_{DMREG} \times R_{SC} = V_{TH}.$$

Generation of positive and negative voltages by a gate driver product has several advantages. Positive turn-on voltages $V_{POSH}$ and $V_{POSL}$ are independently regulated to target levels irrespective of a load on other gate drivers. Negative turn-off voltages $V_{NEGH}$ and $V_{NEGL}$ are less sensitive to variation and thus have the same level of regulation as external supply voltages ($V_{VDDOH}$-$V_{GNDOH}$) and ($V_{VDDOL}$-$V_{GNDOL}$). The positive control voltage can be adjusted independently to trim on-resistance of the switching devices and to improve efficiency performance. Generation of the positive and negative voltages by the gate driver product reduces the overhead utilized for generation of the regulated positive turn-on voltages as compared to conventional techniques. Generation of the positive and negative voltages by the gate driver product simplifies the external power supply design by relaxing accuracy requirements, reducing transformer cost, and reducing parasitic capacitive coupling between windings of the transformer thereby reducing the switching noise coupling between gate drivers.

In an embodiment, re-use of the switch turn-off current further reduces power dissipation of the programmable voltage regulator. Turn-on of high-power drive device SW-H discharges regulator filter capacitor $C_P$ coupled to programmable voltage regulator 208. During turn-off of high-power drive device SW-H, the current required to discharge the gate capacitance of high-power drive device SW-H recharges regulator filter capacitor Cr coupled to programmable voltage regulator 208.

Figure 4:
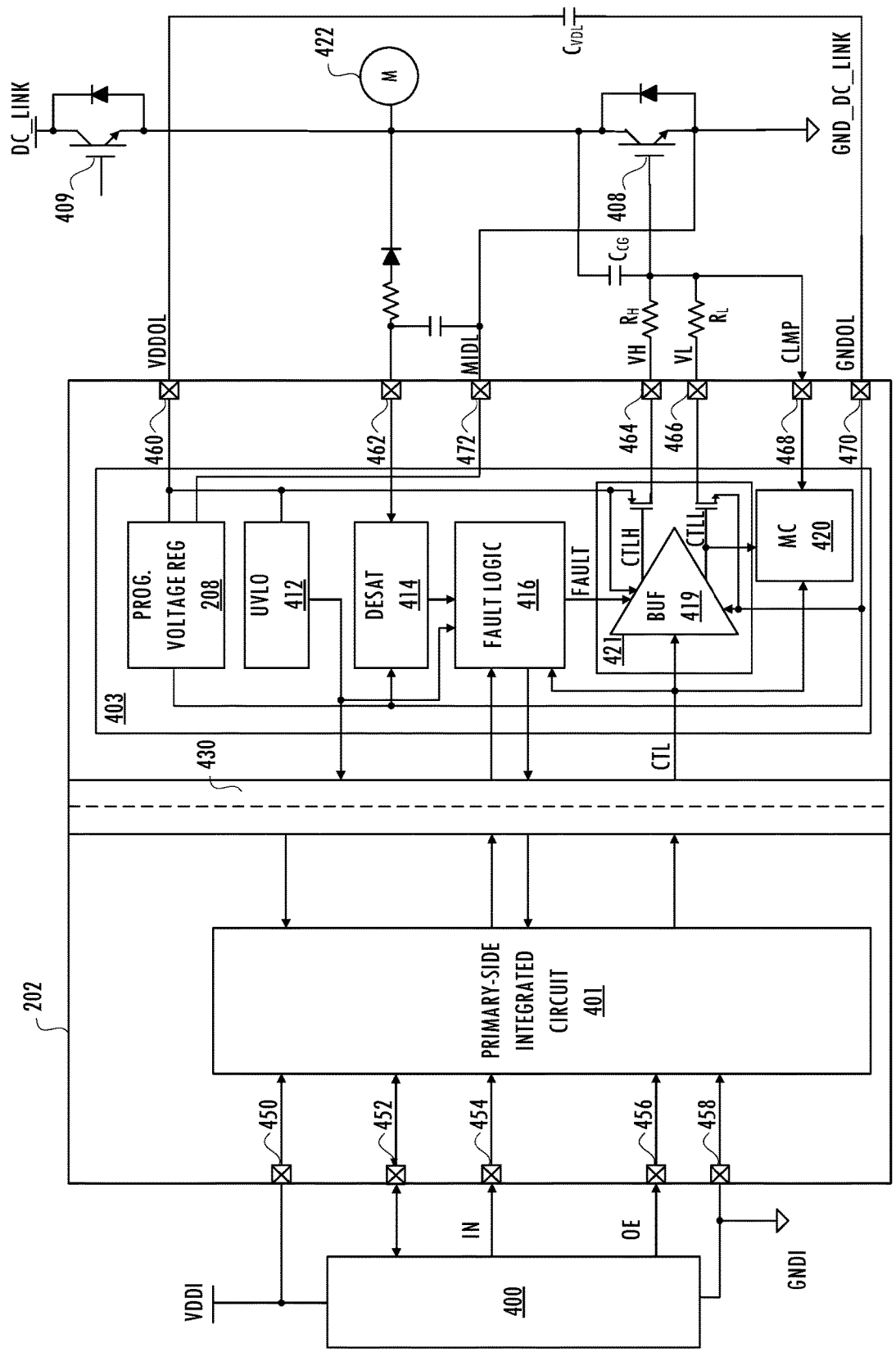
FIG. 4 illustrates a gate driver circuit including a programmable voltage regulator consistent with at least one embodiment of the invention.

Referring to FIG. 4, programmable voltage regulator 208 is included in an exemplary motor control application. Processor 400 receives a voltage (i.e., VDDI, e.g., 5V) and provides one or more signals for a high-power load system operating in a second domain (i.e., DC_LINK, e.g., hundreds of volts). Gate driver product 202 includes isolation barrier 430 and a communication channel for safely communicating control signals from processor 400 across isolation barrier 430 to drive a high-power drive device of a three-phase inverter used to deliver three-phase power to motor 422. In an exemplary embodiment, gate driver product 202 includes multiple integrated circuits configured as a multi-chip module in a single package. For example, gate driver product 202 includes primary-side integrated circuit 401 and secondary-side integrated circuit 403. Secondary-side integrated circuit 403 includes programmable voltage regulator 208 configured to generate voltage $V_{MIDL}$, which is coupled to high-power drive device 408. Primary-side integrated circuit 401, receives a control signal from processor 400 and communicates the signal across isolation barrier 430 to secondary-side integrated circuit 403. In such embodiments, terminals 450, 452, 454, . . . , 472 are pins of a package of the multi-chip module and are coupled to external elements, e.g., discrete resistors and capacitors, and to processor 400.

In an embodiment, gate driver product 202 includes isolation barrier 430, which isolates the domains on a first side (e.g., primary-side integrated circuit 401) of gate driver product 202, which operates using VDDI (e.g., a voltage less than ten volts), and a second side (e.g., secondary-side integrated circuit 403) of gate driver product 202, which operates using an isolated supply VDDOL coupled between terminals VDDOL and GNDOL (e.g., a voltage of tens of volts). An isolation communications channel facilitates communication between primary-side integrated circuit 401 and secondary-side integrated circuit 403. Any suitable communications technique that does not use a conductive path between the two sides may be used, e.g., optical, capacitive, inductive, or electromagnetic techniques. The isolation communications channel facilitates communication of a control signal to secondary-side integrated circuit 403 from processor 400 via primary-side integrated circuit 401.

An exemplary isolation communications channel uses digital modulation (e.g., on-off keying modulation) to communicate one or more digital signals between primary-side integrated circuit 401 and secondary-side integrated circuit 403, although other communication protocols may be used. In general, on-off keying modulation is a form of amplitude-shift keying modulation that represents digital data as the presence or absence of a carrier wave or oscillating signal having a carrier frequency $f_c$ (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, the isolation communications channel may use other types of signals (e.g., pulse width modulated signals or other types of amplitude shift keying modulated signals). The digital modulation scheme used may be determined according to performance specifications (e.g., signal resolution) and environment (e.g., probability of transient events) of the target application.

Secondary-side integrated circuit 403 includes driver 421, which generates one or more output control signals based on received control signal CTL received from primary-side integrated circuit 401, which receives control signal IN on terminal 454 from processor 400. Driver 421 provides corresponding signals to terminals 464 and 466. Buffer 419 generates control signals CTLH and CTLL at appropriate signal levels for controlling pull-up and pull-down devices of driver 421, respectively. Buffer 419 may generate one control signal or two separate control signals for the pull-up device and the pull-down device based on received control signal CTL. External resistance $R_H$ adjusts the pull-up strength by $1/R_H$ independently from external resistance $R_L$ that adjusts the pull-down strength by $1/R_L$. Although received control signal CTL is illustrated as a single-ended signal based on input control signal CTL received from processor 100 on terminal 454, note that in other embodiments, input control signal IN and received control signal CTL are differential signals. In general, signals illustrated herein as single-ended signals may be implemented as differential signals in other embodiments and signals illustrated herein as differential signals may be implemented as single-ended signals in other embodiments.

The pull-up strength and the pull-down strength of the output control signal provided to the control terminal of high-power drive device 408 can be independently adjusted from on-resistance $R_{DS(ON)}$ of the integrated pull-up output device coupled to terminal 464 using one or more passive elements. For example, resistance $R_H$ adjusts the pull-up strength. Resistor $R_L$ adjusts the pull-down strength of the signal provided to the gate of high-power drive device 408 via terminal 466 to have a strength different from the pull-up strength of the signal provided to the gate of high-power drive device 408. In a typical configuration, the pull-up time is faster than the pull-down time and resistances $R_H$ and $R_L$ will vary with specifications of the device (e.g., power MOSFET, IGBT, GaN MOSFET, Si-Carbide power MOSFET, etc.) used as high-power drive device 408.

In at least one embodiment, the isolation communications channel feeds back voltage information or fault information from secondary-side integrated circuit 403 to primary-side integrated circuit 401. Primary-side integrated circuit 401 or processor 400 uses that information to adjust operating parameters or to generate one or more fault indicators that may be used for automatically handling faults by controlling output driver 421 accordingly. For example, secondary-side integrated circuit 403 includes modules that detect fault conditions associated with high-power drive devices, e.g., desaturation detector 414, and may also detect user-initiated faults received from processor 400. Fault indicator(s) may be used by secondary-side integrated circuit 403 to prevent damage to the high-power drive devices, load system, or user of the load system. In addition, secondary-side integrated circuit 403 may send an indication of a fault or associated diagnostic information to primary-side integrated circuit 401 and/or processor 400.

In at least one embodiment, secondary-side integrated circuit 403 includes desaturation fault protection for high-power semiconductor devices, which protects against short-circuit current events that may destroy high-power drive device 408. This fault may result from an insufficient gate drive signal caused by inverter gate driver misbehavior, drive supply voltage issues, a short circuit in a power stage, or other excessive current or power dissipation of the high-power drive devices. Those events can substantially increase power consumption that quickly overheats and damages the corresponding high-power drive device. For example, when a short circuit current condition occurs in the exemplary motor drive application of FIGS. 4 and 5 (e.g., both devices of an individual inverter phase of a three-phase inverter are on), high current flows through high-power drive devices 408 and 409 and may destroy high-power drive devices 408 and 409. Accordingly, a fault detection technique detects this desaturation condition. Gate driver product 202 may send an indicator thereof to processor 400.

In at least one embodiment of gate driver product 202, desaturation fault protection turns off high-power drive device 408 following detection of the fault condition. In a typical application, terminal 462 is coupled to an external resistor and diode that are coupled to a terminal of high-power drive device 408 (e.g., the collector terminal of an IGBT or drain terminal of a MOSFET). In at least one embodiment of gate driver product 202, desaturation detection circuit 414 is enabled only while high-power drive device 408 is turned on. Desaturation detection circuit 414 senses when the collector-emitter voltage (or drain-to-source voltage, as the case may be) of high-power drive device 408 exceeds a predetermined threshold level (e.g., 7V). Note that the predetermined threshold level of desaturation detection circuit 414 may be externally adjusted based on the forward voltage of one or more diodes coupled to the desaturation resistor coupled to terminal 462 or based on the resistance of the desaturation resistor. In addition, a delay time may be introduced by coupling a capacitor between terminal 462 and power supply node MID.

In general, undervoltage lockout detector 412 prevents application of insufficient voltage to the control terminal of high-power drive device 408 by forcing the output on terminal 464 to be low during power-up of driver product 400. Undervoltage lockout detector 412 detects when the power supply voltage (e.g., VDD2 sensed using terminal 460) exceeds a first predetermined undervoltage lockout threshold voltage and generates an indication thereof, which may be used to disable the lockout condition. Undervoltage lockout detector 412 also detects when the power supply voltage falls below a second predetermined undervoltage lockout threshold, which may be different from the first undervoltage lockout threshold voltage, to provide noise margin for the undervoltage lockout voltage detection. The indicator generated by undervoltage lockout detector 412 may be provided to processor 400 using terminal 452. In at least one embodiment, driver product 400 includes a similar mechanism for an overvoltage condition.

In an embodiment of gate driver product 202, Miller clamp 420 reduces effects of parasitic turn-on of high-power drive device 408 due to charging of the Miller capacitor (e.g., the collector-to-gate parasitic capacitor of an IGBT device or the drain-to-gate parasitic capacitor of a MOSFET in other embodiments of high-power device 408). That gate-to-collector coupling can cause a parasitic turn on of device 408 in response to a high transient voltage (e.g., a gate voltage spike) generated while high-power drive device 408 is turned off. A gate voltage spike is created when turning on another high-power drive device coupled to high-power drive device 408.

For example, when turning on high-power drive device 409, high-power drive device 408, which is coupled to upper high-power drive device 409 experiences a voltage change $dV_{CE}/dt$ causing current flow into the gate drive terminal coupled to high-power drive device 408. In the absence of Miller clamp 420, this current would create a voltage drop across external resistance $R_L$ and would increase the gate-to-emitter voltage of high-power drive device 408. If the gate-to-emitter voltage exceeds the device threshold voltage (e.g., 2 V), then high-power drive device 408 turns on. A similar parasitic turn-on event occurs when turning on high-power drive device 408 and the high-power drive device 409 is in an off state. Miller clamp 420 prevents parasitic turn-on by coupling terminal 468 to ground via a low-resistance switch that hinders or prevents the Miller capacitor current from developing a voltage sufficient to turn on the high-power drive device.

In some embodiments of gate driver product 202, Miller clamp 420 is not needed because a sufficiently sized gate capacitor coupled between the gate and emitter of high-power drive device 408 shunts any Miller current and raises the level of the transient needed to parasitically turn on the device. However, such embodiments increase the gate charge voltage required to reach the threshold voltage of high-power drive device 408, increase the driver power, and increase switching losses of high-power drive device 408. In other embodiments of gate driver product 202 that do not use a Miller clamp circuit, the lower supply voltage is coupled to a negative voltage (e.g., −5 V) rather than ground. This configuration provides additional voltage margin to increase the likelihood that the parasitic turn-on transient does not raise the control terminal of high-power drive device 408 above its threshold voltage. However, this configuration increases cost by requiring an additional pin on the package and requiring generation of the negative voltage.

Upon detection of a fault condition by modules on secondary-side integrated circuit 403, fault logic 416 generates control signal FAULT, which may initiate shutdown of high-power drive device 408. Fault logic 416 reports the fault condition to processor 400 via primary-side integrated circuit 401. Alternatively, fault logic 416 only reports the fault condition to primary-side integrated circuit 401 and high-power drive device 408 continues operation. Then, primary-side integrated circuit 401 reports the fault condition to processor 400. Since a system may include multiple high-power drive devices (e.g., six high-power drive devices in the exemplary motor control application described herein), shutting down only one of these devices may harm the high-power drive devices or the load. Therefore, in response to detection of a fault, processor 400 may initiate a shutdown of high-power drive device 408 only after detecting a predetermined number of faults over a particular period of time or other condition is satisfied. In at least one embodiment, processor 400 initiates shutdown of high-power drive device 408 independently from any fault detection of gate driver product 202 (e.g., based on fault detection from another gate driver product 202 associated with another high-power drive device 408 or 409).

An abrupt shutoff of high-power drive device 408 may result in large di/dt induced voltages. Such voltage spikes could be damaging to high-power drive circuit 408 or the load. Accordingly, in response to a fault condition, processor 400 or gate driver product 202 initiates a soft shutdown of high-power drive device 408 that slowly discharges the control terminal of high-power drive device 408 at a rate having a turn-off time longer than the regular turn-off time of the output control signal. For example, fault logic 416 receives an indicator from desaturation detection circuit 414 and generates control signal FAULT based thereon that initiates a soft shutdown. In other embodiments, fault logic 416 receives an indicator from one or more other fault detection circuits. Typical implementations of a soft-shutdown function in a driver product may use an additional terminal or at least one additional external resistor coupled to terminal 464 or terminal 466.

Figure 5:
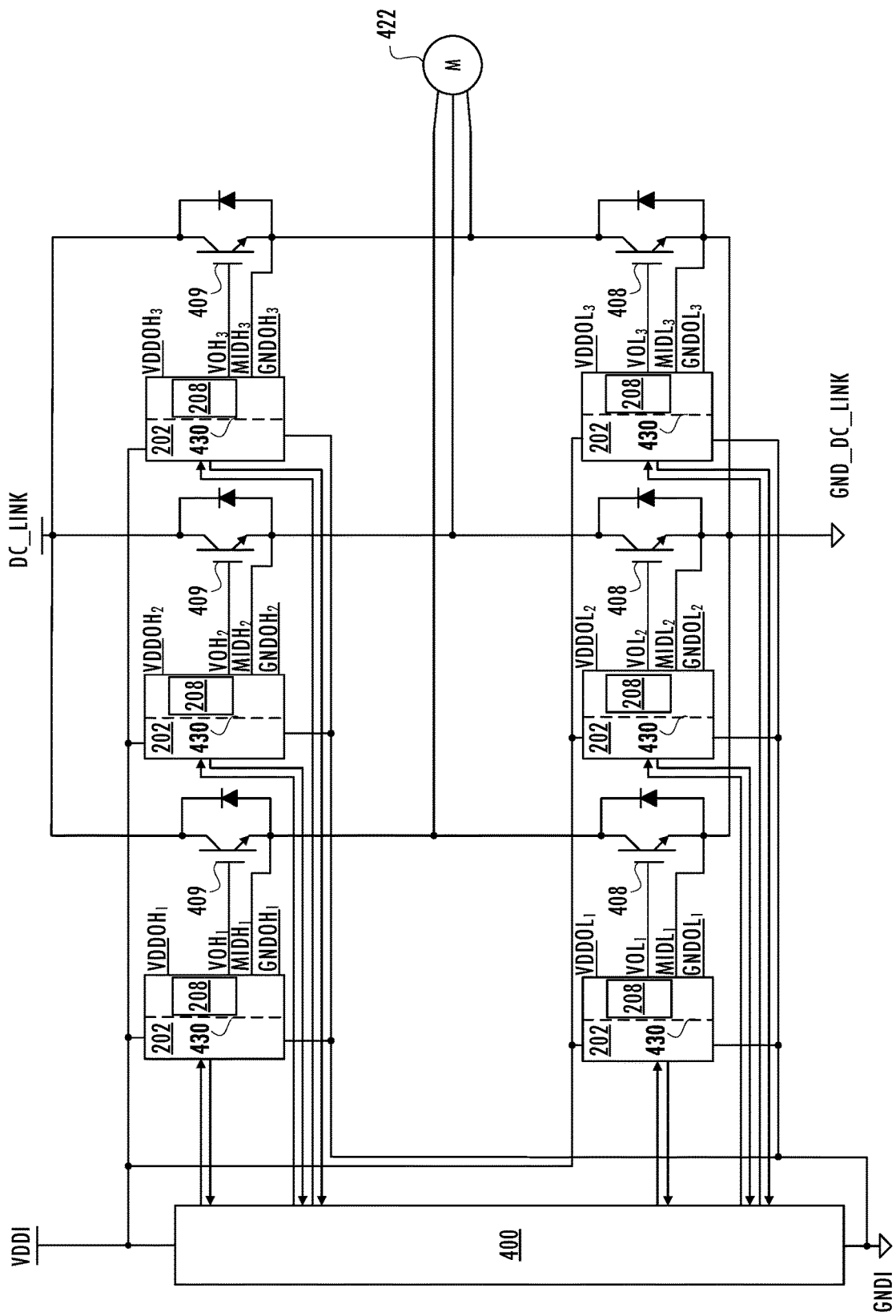
FIG. 5 illustrates a power supply arrangement for a high-side and a low-side gate driver in an exemplary application consistent with at least one embodiment of the invention.

Referring to FIG. 5, in an exemplary motor control application, processor 400, which may be a microprocessor, microcontroller, or other suitable processing device, operates in a first domain (i.e., VDDI, e.g., 5 Volts (V)) and provides one or more signals for a high-power load system operating in a second domain (i.e., DC_LINK, e.g., 800 V). Motor 422 uses high levels of three-phase power. Each instantiation of gate driver product 202 corresponds to a high-power device coupled to DC_LINK (high-side inverter devices) and grounded at a voltage that is switching with respect to GND_DC_LINK by the high voltage levels of DC_LINK, and includes an isolation barrier 430 and an isolation communications channel for safely communicating control signals from processor 400 to drive a corresponding high-power drive device of a three-phase inverter used to deliver three-phase power to motor 422, as described above. Each instantiation of gate driver product 202 includes a programmable voltage regulator 208, as described above.

Thus, techniques for providing positive and negative gate control voltages for a high-side gate driver and a low-side gate driver in a half-bridge configuration have been disclosed. The description of the invention set forth herein is illustrative and is not intended to limit the scope of the invention as set forth in the following claims. For example, while the invention has been described in an embodiment in which programmable voltage regulator 208 is used in gate driver product 202, one of skill in the art will appreciate that the teachings herein can be utilized in other applications. In addition, programmable voltage regulator 208 may include other types of voltage regulator architectures, e.g., include an integrated DC-DC controller or a charge pump that generates the positive turn-on voltage $V_{POS}$. Variations and modifications of the embodiments disclosed herein, may be made based on the description set forth herein, without departing from the scope of the invention as set forth in the following claims.

What is claimed is:

1. A method for controlling a high-power drive device, the method comprising:

generating a positive turn-on voltage and a negative turn-off voltage for the high-power drive device by a first gate driver product based on a first power supply voltage received from a first integrated circuit terminal, a second power supply voltage received from a second integrated circuit terminal, and a regulated power supply voltage on a third integrated circuit terminal, the positive turn-on voltage being a difference between the first power supply voltage and the regulated power supply voltage and has a predetermined voltage level.

2. The method as recited in claim 1 further comprising:
receiving the first power supply voltage from the first integrated circuit terminal;
receiving the second power supply voltage from the second integrated circuit terminal;
generating the regulated power supply voltage based on the first power supply voltage and the second power supply voltage;
providing the regulated power supply voltage to the third integrated circuit terminal; and
providing a control signal to a control terminal of the high-power drive device via a fourth integrated circuit terminal.

3. The method as recited in claim 1 further comprising selecting the predetermined voltage level using a programmable resistor or a programmable voltage reference.

4. The method as recited in claim 1 wherein generating the positive turn-on voltage and the negative turn-off voltage includes:
converting a voltage drop across the first integrated circuit terminal and a third power supply terminal to a single-ended voltage;
generating a bias control signal based on a comparison of the single-ended voltage to a predetermined reference voltage; and
generating a bias current through a node coupled to the third integrated circuit terminal according to the bias control signal.

5. The method as recited in claim 4 wherein generating the positive turn-on voltage and the negative turn-off voltage further includes providing a startup current to charge a first external capacitor during a startup sequence, the startup current being greater than the bias current.

6. The method as recited in claim 1 further comprising:
providing charge to a control terminal of the high-power drive device by a first external capacitor during a turn-on event; and
receiving charge from the control terminal by the first external capacitor during a turn-off event.

7. The method as recited in claim 1 wherein the first power supply voltage and the second power supply voltage are received from a power supply, the method further comprising:
generating the regulated power supply voltage based on the first power supply voltage and the second power supply voltage;
generating a second regulated power supply voltage based on a third power supply voltage received from the power supply and a fourth power supply voltage received from the power supply; and
generating a second positive turn-on voltage and a second negative turn-off voltage for a second high-power drive device by a second gate driver product based on the third power supply voltage, the fourth power supply voltage, and the second regulated power supply voltage, the second positive turn-on voltage being a difference between the third power supply voltage and the second regulated power supply voltage and has a second predetermined voltage level, the high-power drive device and the second high-power drive device being coupled in a half-bridge configuration.

8. A system for controlling a high-power drive device, the system comprising:
an output terminal of a driver integrated circuit;
a first power supply terminal of the driver integrated circuit configured to receive a first power supply voltage;
a second power supply terminal of the driver integrated circuit configured to receive a second power supply voltage;
a third power supply terminal of the driver integrated circuit configured to provide a regulated voltage; and
a voltage regulator circuit of the driver integrated circuit configured to provide the regulated voltage, the regulated voltage having a level between a first level of the first power supply voltage and a second level of the second power supply voltage and the regulated voltage being based on a predetermined voltage level for a difference between the first power supply voltage and the regulated voltage.

9. The system as recited in claim 8 wherein the predetermined voltage level is selectable using a programmable resistance or a programmable voltage reference of the voltage regulator circuit.

10. The system as recited in claim 8 wherein the predetermined voltage level is a positive turn-on voltage of the high-power drive device.

11. The system as recited in claim 8 further comprising the high-power drive device, the high-power drive device being external to the driver integrated circuit, the third power supply terminal being coupled to a first terminal of the high-power drive device, and the output terminal being coupled to a control terminal of the high-power drive device.

12. The system as recited in claim 8 further comprising:
a first capacitor coupled to the first power supply terminal and the third power supply terminal, the first capacitor being external to the driver integrated circuit; and
a second capacitor coupled to the first power supply terminal and the second power supply terminal, the second capacitor being external to the driver integrated circuit,
the first capacitor configured to provide charge to a control terminal of the high-power drive device during a turn-on event and configured to receive charge from the control terminal during a turn-off event.

13. The system as recited in claim 8 wherein the voltage regulator circuit includes:
a differential-to-single-ended voltage converter configured to generate a single-ended voltage corresponding to a voltage drop across the first power supply terminal and the third power supply terminal; and
a comparator configured to generate a bias control signal based on a comparison of the single-ended voltage to a predetermined reference voltage.

14. The system as recited in claim 13 wherein the voltage regulator circuit includes a bias current generator configured to provide a bias current into a node coupled to the third power supply terminal according to the bias control signal, the bias current being configured to provide a startup current to charge a first external capacitor to the predetermined voltage level and the bias current is configured to provide a maintenance current to maintain the first external capacitor at the predetermined voltage level.

15. The system as recited in claim 13 wherein the differential-to-single-ended voltage converter includes:
an operational amplifier;
a pair of input resistors, each input resistor of the pair of input resistors having a first resistance and being coupled to a corresponding input of a differential pair of inputs of the operational amplifier; and a pair of output resistors, each output resistor of the pair of output resistors having a second resistance, a first output resistor of the pair of output resistors being coupled between an inverting input of the differential pair of inputs and to an output of the operational amplifier, and a second output resistor of the pair of output resistors being coupled between a non-inverting input of the differential pair of inputs and the second power supply terminal, the level of the regulated voltage related to a ratio of the second resistance to the first resistance and the predetermined reference voltage.

16. The system as recited in claim 8 further comprising:
a first gate driver product including the driver integrated circuit;
a first high-power drive device coupled to the first gate driver product;
a second gate driver product including a second driver integrated circuit having a fourth power supply terminal, fifth power supply terminal and a sixth power supply terminal, the second driver integrated circuit being configured to provide a second regulated voltage on the sixth power supply terminal;
a second high-power drive device coupled to the second gate driver product, the first high-power drive device and the second high-power drive device being coupled in a half-bridge configuration; and
a power supply coupled to the first gate driver product and the second gate driver product, the power supply having a first positive terminal, a second positive terminal, a first ground terminal, and a second ground terminal, the first power supply terminal being coupled to the first positive terminal and the second power supply terminal being coupled to the first ground terminal, the fourth power supply terminal being coupled to the second positive terminal and the fifth power supply terminal being coupled to the second ground terminal.

17. A method for controlling a high-power drive device, the method comprising:
charging a control node of the high-power drive device by delivering charge from a voltage regulator filter capacitor and from a first power supply node via a gate driver coupled between the first power supply node and a second power supply node, the high-power drive device being coupled to a third power supply node;
discharging the control node of the gate driver by delivering charge to the voltage regulator filter capacitor and to the second power supply node via the gate driver; and
providing a regulated voltage to the third power supply node based on a first voltage on the first power supply node, a second voltage on the second power supply node, and a predetermined turn-on voltage level.

18. The method as recited in claim 17 further comprising selecting the predetermined turn-on voltage level using a programmable resistor or a programmable voltage reference.

19. The method as recited in claim 17 wherein generating the predetermined turn-on voltage level includes:
converting a voltage drop across the first power supply node and the third power supply node to a single-ended voltage;
generating a bias control signal based on a comparison of the single-ended voltage to a predetermined reference voltage; and
generating a bias current through a node coupled to the third power supply node according to the bias control signal.

20. The method as recited in claim 19 wherein generating the predetermined turn-on voltage level further includes providing a startup current to charge a first external capacitor during a startup sequence, the startup current being greater than the bias current.

21. The method as recited in claim 17 further comprising:
receiving by an integrated circuit a first power supply voltage from the first power supply node;
receiving by the integrated circuit a second power supply voltage from the second power supply node; and
providing by the integrated circuit a control signal to a control terminal of the high-power drive device, the integrated circuit providing the regulated voltage to the third power supply node.

22. The method as recited in claim 17 wherein the first power supply node and the second power supply node are coupled to a power supply, the method further comprising:
charging a second control node of a second high-power drive device by delivering charge from a second voltage regulator filter capacitor and from a fourth power supply node via a second gate driver coupled between the fourth power supply node and a fifth power supply node, the second high-power drive device being coupled to a sixth power supply node, the high-power drive device and the second high-power drive device being coupled in a half-bridge configuration; and
discharging the second control node of the second gate driver by delivering charge to the second voltage regulator filter capacitor and to the fifth power supply node via the second gate driver; and
providing a second regulated voltage to the sixth power supply node based on a third voltage on the fourth power supply node, a fourth voltage on the fifth power supply node, and a second predetermined turn-on voltage level.

* * * * *